United States Patent
Jung et al.

(10) Patent No.: US 11,488,658 B2
(45) Date of Patent: Nov. 1, 2022

(54) WRITE ASSIST SCHEME WITH BITLINE

(71) Applicant: QUALCOMM Incorporated, San Diego, CA (US)

(72) Inventors: Chulmin Jung, San Diego, CA (US); Bin Liang, San Diego, CA (US); Chi-Jui Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 174 days.

(21) Appl. No.: 16/862,238

(22) Filed: Apr. 29, 2020

(65) Prior Publication Data
US 2021/0343330 A1    Nov. 4, 2021

(51) Int. Cl.
| G11C 11/4094 | (2006.01) |
| G11C 5/02 | (2006.01) |
| G11C 7/12 | (2006.01) |
| G11C 11/4074 | (2006.01) |
| G11C 11/4096 | (2006.01) |

(52) U.S. Cl.
CPC .......... *G11C 11/4094* (2013.01); *G11C 5/025* (2013.01); *G11C 7/12* (2013.01); *G11C 11/4074* (2013.01); *G11C 11/4096* (2013.01)

(58) Field of Classification Search
CPC ....... G11C 11/4094; G11C 5/025; G11C 7/12; G11C 11/4074; G11C 11/4096
USPC ........................................ 365/185.01–185.33
See application file for complete search history.

(56) References Cited

U.S. PATENT DOCUMENTS

| 5,321,655 | A | * | 6/1994 | Iwahashi | .................. | G11C 7/14 |
| | | | | | | 365/185.09 |
| 7,460,391 | B2 | | 12/2008 | Lee et al. | | |
| 7,542,369 | B2 | | 6/2009 | Kenkare et al. | | |
| 7,978,515 | B2 | * | 7/2011 | Iwata | ..................... | G11C 16/26 |
| | | | | | | 365/185.05 |
| 8,773,918 | B2 | | 7/2014 | Tanabe | | |
| 8,958,237 | B1 | | 2/2015 | Yang et al. | | |
| 9,583,180 | B2 | | 2/2017 | Holst | | |
| 2006/0262628 | A1 | * | 11/2006 | Nii | ........................ | G11C 11/412 |
| | | | | | | 365/226 |
| 2008/0247232 | A1 | * | 10/2008 | Iwata | ..................... | G11C 16/26 |
| | | | | | | 365/185.05 |
| 2014/0219039 | A1 | * | 8/2014 | Jung | ........................ | G11C 7/12 |
| | | | | | | 365/189.16 |

(Continued)

OTHER PUBLICATIONS

International Search Report and Written Opinion—PCT/US2021/070458—ISA/EPO—dated Jul. 29, 2021.

*Primary Examiner* — Tuan T Nguyen
(74) *Attorney, Agent, or Firm* — Qualcomm Incorporated (57) ABSTRACT

Methods and apparatuses having an improved write assist scheme are presented. An apparatus includes a power supply node configured to provide power from a power supply to one memory cell to store data; a bitline configured to provide write data to the one memory cell in a write operation; and a discharge circuit configured to selectively discharge the power supply node to the bitline, based on the write data. A method to write into a memory cell with a write assist scheme includes providing power from a power supply to one memory cell via a power supply node, to store data; providing write data to the one memory cell via a bitline in a write operation; and discharging, selectively based on the write data, the power supply node to the bitline.

27 Claims, 7 Drawing Sheets

(56) References Cited

U.S. PATENT DOCUMENTS

2015/0103604 A1 4/2015 Sheikh et al.
2015/0235695 A1 8/2015 Chen et al.

\* cited by examiner

WRITE ASSIST SCHEME WITH BITLINE

BACKGROUND

Field

The present disclosure relates generally to methods and apparatuses having improved write assist scheme and more particularly, to a memory configured to lower a voltage on a power supply node to assist in a write operation.

Background

A computing device (e.g., a laptop, a mobile phone, etc.) may include one or several processors to perform various functions, such as telephony, wireless data communication, artificial intelligence, and camera/video function, etc. A memory is an important component of the computing device. The one processor may be coupled to the memory to perform the aforementioned computing functions. For example, the one processor may fetch instructions from the memory to perform the computing functions and/or to store within the memory temporary data for processing these computing functions, etc. Improvements in performance of the memory would likewise improve the computing device.

SUMMARY

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes multiple memory cells, a power supply node configured to provide power from a power supply to one or more, or all memory cells of the multiple memory cells to store data, a bitline configured to provide write data to the one memory cell in a write operation, and a discharge circuit configured to selectively discharge the power supply node to the bitline, based on the write data (e.g., charges are moved from the power supply node to the bitline).

A method to write into a memory cell with a write assist scheme includes providing power from a power supply to one memory cell of a plurality of memory cells, via a power supply node, to store data; providing write data to the one memory cell via a bitline in a write operation; and discharging, selectively based on the write data, the power supply node to the bitline.

Another apparatus in accordance with at least one embodiment includes multiple memory cells; a power supply node configured to provide power from a power supply to one memory cell of the plurality of memory cells to store data; a pair of bitlines configured to provide write data to the one memory cell in a write operation; a discharge circuit configured to selectively discharge at least a part of charges, which are pulled down from the power supply node, to one bitline of the pair of bitlines in the write operation.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. For example, the term "coupled" may mean that elements A and B communicate or having a transfer of information, either directly or via other elements.

The term "electrically connected" may mean having an electric current or configurable to having an electric current flowing between the elements A and B. In some examples, the term "electrically connected" may mean transfer of electrical energy between elements A and B, to operate certain intended function. For example, the elements A and B may be connected via resistors, transistors, or an inductor, in addition to a wire, trace, or other electrically conductive material and components.

The terms "first," "second," "third," etc. are employed for ease of reference and may not carry substantive meanings. Likewise, names for components/modules may be adopted for ease of reference and might not limit the components/modules. For example, such non-limiting names may include "discharge" transistor and/or "control" transistor; etc. In some examples, modules and components presented in the disclosure may be implemented by circuits. Such circuits may operate, at least in part, in accordance with software/firmware instructions.

The terms "bus system" and/or "signal connection" may provide that elements coupled thereby may exchange information therebetween, directly or indirectly. In such fashion, the terms "bus system" and/or "signal connection" may encompass multiple physical connections as well as intervening stages such as buffers, latches, registers, etc.

In the disclosure, a memory may be embedded with a processor on a semiconductor die or be part of a semiconductor die different from the processor. The memory may perform various functions. For example, the memory may be used as cache, register file, or storage. The memory may be of various kinds. For example, the memory may be static random access memory (SRAM), dynamic random access memory (DRAM), magnetic random access memory (MRAM), NAND flash, or NOR flash, etc.

As semiconductor process advances, write operations in memory are becoming increasingly difficult. For example, lower supply voltages reduce write margin. In some examples, write margin may refer to tolerances (e.g., in terms of signal timing, voltage levels, etc.) allowing for writing data correctly into a memory cell. Further, in FinFET processes, ratios of p-type and n-type transistors in a memory cell cannot be easily adjusted as in previous processes. Write assist schemes are developed to improve write margins in advanced semiconductor processes. One such write assist scheme pulls down a voltage on a power supply node of the memory cell to improve write margin. The lowered voltage would improve writing (write) data into the memory cell. However, pulling down the voltage on the power supply node causes unnecessarily and undesirable power consumption.

Methods and apparatuses utilizing an improved write assist scheme are presented. In some examples, a voltage of the power supply node is discharged (e.g., lowered) to a bitline configured to carry write data to the memory cell, the write data causing the bitline to be pulled up or configured to be pulled up. Accordingly, charges discharged from the power supply node may be used to charge (e.g., to pull up) the bitline in a write operation. In such fashion, power consumption is reduced.

Figure 1:
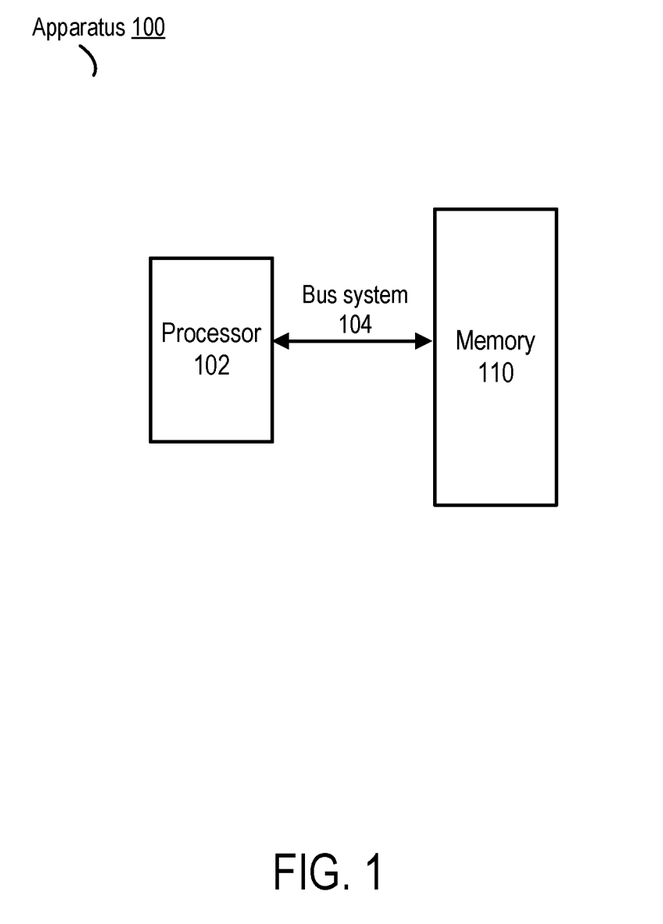
FIG. 1 illustrates an apparatus incorporating at least one processor and a memory, in accordance with certain aspects of the disclosure.

Methods and apparatuses are presented in the present disclosure by way of non-limiting example of a static random access memory (SRAM) and a write operation thereto to illustrate aspects of an improved write assist scheme. FIG. 1 illustrates an apparatus 100 incorporating at least one processor 102 and a memory 110, in accordance with certain aspects of present disclosure. The apparatus 100 may include, for example, one of computing systems (e.g., servers, datacenters, desktop computers), mobile computing device (e.g., laptops, cell phones, vehicles, etc.), Internet of Things devices, virtual reality (VR) systems, or augmented reality (AR) systems. The processor 102 may include a collection of processing logics or one or more central processing unit. FIG. 1 illustrates that the apparatus 100 incorporates the at least one processor 102 coupling to the memory 110 via a bus system 104. The at least one processor 102 and the memory 110 may be on a same semiconductor die or on different dies. The at least one processor 102 may be coupled to the memory 110 to perform a computing function, such as one of data processing, data communication, graphic display, camera, AR or VR rendering, image processing, etc. For example, the memory 110 may store instructions or data for the at least one processor 102 to perform the aforementioned computing functions.

Figure 2:
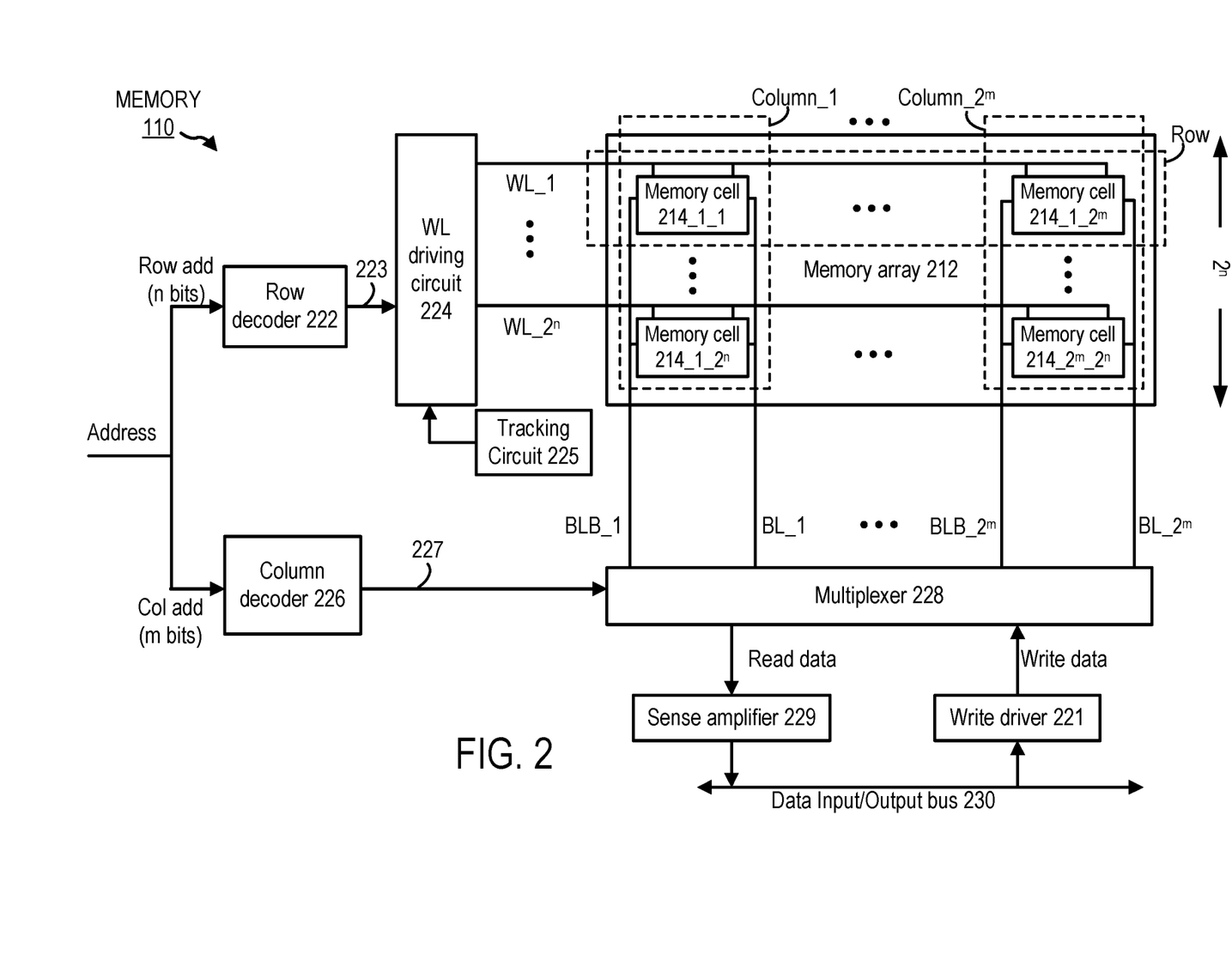
FIG. 2 illustrates functional blocks of the memory of FIG. 1, in accordance with certain aspects of the disclosure.

FIG. 2 illustrates functional blocks of the memory 110 of FIG. 1, in accordance with certain aspects of present disclosure. By way of example, the memory 110 is presented as an SRAM having a memory array 212. For illustrative purposes, the memory 110 is shown as configured as having a 1-bit access (reading or writing one bit for each access). The memory 110 may read or write multiple bits for each access (e.g., ×8, ×16, ×32). The memory array 212 includes multiple memory cells 214 (e.g., 214_1_1 to 214_2$^m$_2$^n$) arranged in multiple rows (labeled "row" as an example) and multiple columns (labeled "column" as an example). Each memory cells 214 may store one data bit (logic one or logic zero). As illustrated, the memory array 212 includes 2$^n$ rows and 2$^m$ columns. In some examples, "m" and "n" may be integers greater or equal to one. To access the memory cells 214, the memory 110 may include a row decoder 222, a wordline driving circuit 224 (shown in FIG. 2 as WL driving circuit 224), a column decoder 226, a multiplexer 228, a write driver 221, and/or a sense amplifier 229. FIG. 2 further illustrates a data input/output bus 230 to provide/receive data to/from the memory 110. In some examples, the data input/output bus 230 may be coupled to the bus system 104 (FIG. 1) to provide data read from the memory 110 to (or to receive data to be written into the memory 110/from) the at least one processor 102.

The memory 110 may be configured to receive address as input to access (e.g., to read or to write) a memory cell (or memory cells) 214 corresponding to the address. A row decoder 222 may be configured to receive n bits of the address as row address, decode the row address, and provide decoded row address 223 to the wordline driving circuit 224. The wordline driving circuit 224 may be configured to output 2$^n$ wordlines (WL_1 to WL_2$^n$). Each of the wordlines WL_1 to WL_2$^n$ may be coupled to a corresponding row of memory cells 214 to for a read or wrote operation (e.g., to enable access of that row). A column decoder 226 may be configured to receive m bits of the address as column address, decode the column address, and output decoded column address 227 to select among the 2$^m$ columns of data.

Each memory cell 214 may be configured to electrically connect or couple to a bitline pair BL and BLB, and each column of the memory cells 214 may be configured to share a same bitline pair BL and BLB. Thus, in FIG. 2, there are 2$^m$ bitline pairs (e.g., BL_1 to BL_2$^m$; BLB_1 to BLB_2$^m$). In an access, the wordline driving circuit 224 may be configured to provide (e.g., drives or effects) a voltage level onto one wordline among WL_1 to WL_2$^n$, selected by the row address, to access a row of memory cells 214 coupled to the one wordline (e.g., to facilitate read or write operation to the row of memory cells 214 coupled to the one wordline). For read access (e.g., the memory 110 being in a read operation), the row of memory cells 214 may be configured to provide stored data onto the 2$^m$ bitline pairs BL and BLB. For write access (e.g., the memory 110 being in a write operation), write data may be provided onto the 2$^m$ bitline pairs BL and BLB and written into the row of memory cells 214.

The multiplexer 228 may be configured to select one bitline pair BL and BLB, based on the decoded column address 227, for read and/or write accesses. In a read operation, the multiplexer 228 may be configured to select one bitline pair BL and BLB and provides data on the selected bitline pair BL and BLB, as read data, to the sense amplifier 229. The sense amplifier 229 may be configured to amplify and/or store read data from the memory array 212, via the multiplexer 228, and output the amplified read data onto a data input/output bus 230. In a write operation, the write driver 221 may be configured to receive input data from the data input/output bus 230 and output to the multiplexer 228 as write data. The multiplexer 228 may be configured to select one bitline pair BL and BLB (based on the decoded column address 227) and provide the write data to the selected bitline pair BL and BLB.

Figure 3:
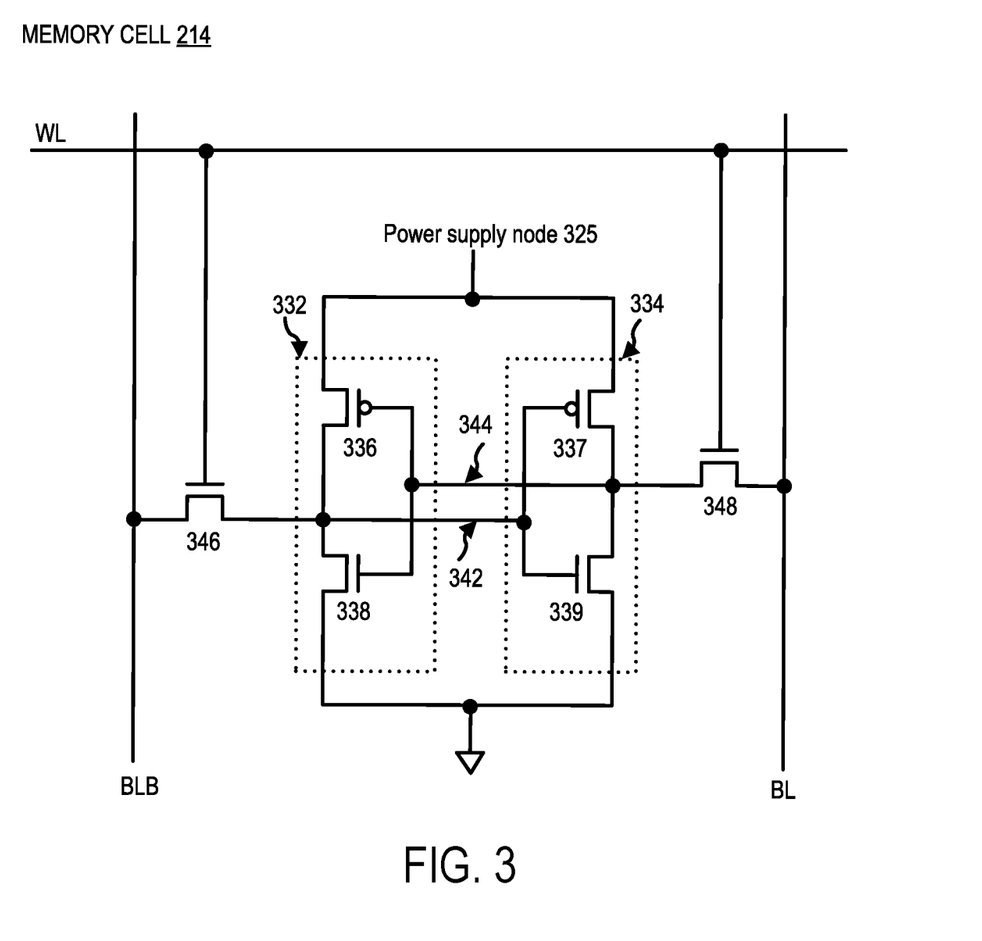
FIG. 3 illustrates a memory cell of FIG. 2, in accordance with certain aspects of the present disclosure.

FIG. 3 illustrates a memory cell 214 of FIG. 2, in accordance with certain aspects of the present disclosure. FIG. 3 illustrates the memory cell 214 having a p-type transistor 336, a p-type transistor 337, an n-type transistor 338, an n-type transistor 339, and access transistors 346 and 348. The memory cell 214 may be configured to be powered by a supply voltage VDD, via a power supply node 325, and ground. The memory cell 214 may be configured as two, cross-coupled inverters 332 and 334 to store data. The p-type transistor 336 and the n-type transistor 338 may be configured as the inverter 332, and the p-type transistor 337 and the n-type transistor 339 may be configured as the inverter 334. A storage node 342 may be configured to electrically connect or couple to an output of the inverter 332 and to an input the inverter 334. A storage node 344 may be configured to electrically connect or couple to an output of the inverter 334 and to an input of the inverter 332. The data may be stored by the storage nodes 342 and 344 (e.g., logic zero may be stored at the storage node 342 while logic one is stored at the storage node 344 and vice versa, to represent different stored values of a stored bit). In a case that logic zero is stored at the storage node 342 (and logic one is stored at the storage node 344), the n-type transistor 338 may be configured to keep the logic zero at the storage node 342 by keeping the storage node 342 discharged. In a case that logic zero is stored at the storage node 344 (and logic one is stored at the storage node 342), the n-type transistor 339 may be configured to keep the logic zero at the storage node 344 by keeping the storage node 344 discharged.

The access transistors 346 and 348 may be configured to provide read or write access to the storage nodes 342 and 344, to or from the bitline pair BL and BLB. The wordline WL may be configured to turn on the access transistors 346 and 348 to enable accessing one row of the multiple rows of the memory cells 214 (FIG. 2), in a read or write operation. In FIG. 3, the access transistors 346 and 348 are n-type transistors and function as pass-gates. The wordline driving circuit 224 (FIG. 2) may be configured to drive the wordline WL to a voltage level to access the memory cell 214 (e.g., provide a voltage level to the wordline WL to turn on the access transistors 346 and 348 and to facilitate a read or write operation). The voltage level may be a high voltage, such as VDD, to turn on the access transistors 346 and 348 to allow a read or a write of the memory cell 214.

Figure 4:
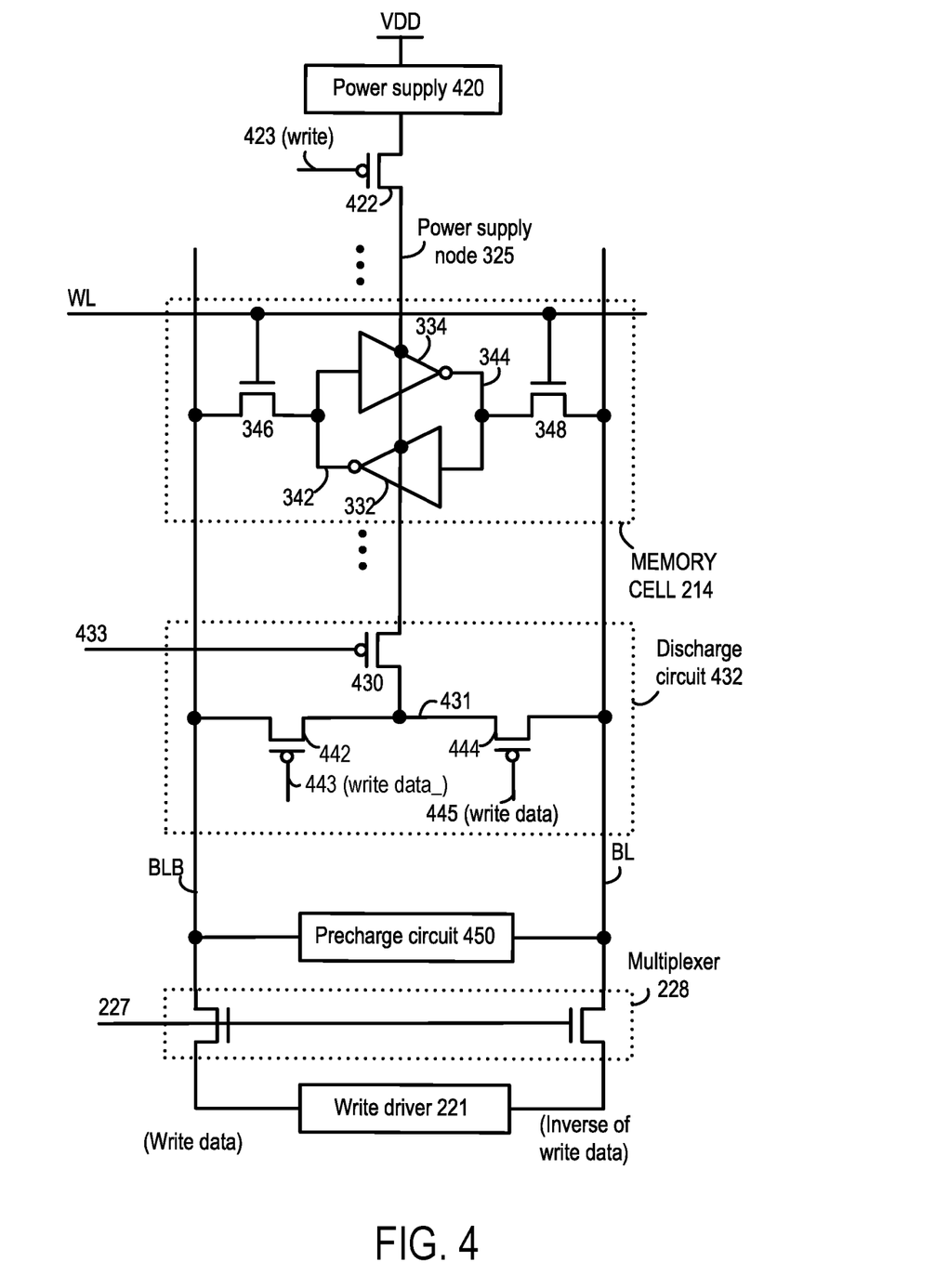
FIG. 4 illustrates the memory of FIGS. 1-2 having an improved write assist scheme, in accordance with certain aspects of the present disclosure.

In a read operation, both of the bitline pair BL and BLB may be precharged to a high voltage level, such VDD. (As an example, a precharge circuit 450 is shown in FIG. 4.) The memory cell 214 may be configured to selectively pull down one of the bitline pair BL and BLB to provide stored bit onto the bitline pair BL and BLB. For example, the storage node 342 stores logic zero (e.g., low voltage level such as ground) and the storage node 344 stores logic one (e.g., a high voltage level such as VDD). In the read operation, the bitline BLB is pulled down via the access transistor 346 by the n-type transistor 338, while the bitline BL remains at the (precharged) high voltage level. Thus, a voltage difference between the bitline pair BL and BLB is produced to indicate a stored bit of the memory cell 214.

In such fashion, the bits stored by a row of memory cells 214 may be provided onto the bitline pairs (BL_1, BLB_1 to BL_2''', BLB_2'''), the row of memory cells 214 being coupled to a wordline (one of WL_1 to WL_2'') driven to a high voltage by the wordline driving circuit 224 (FIG. 2) for the read operation. The multiplexer 228 may be configured to select one bitline pair BL and BLB based on the decoded column address 227 from the column decoder 226 and provide the stored bit from the selected bitline pair BL and BLB (e.g., in form of the voltage difference on the bitline pair BL and BLB) to the sense amplifier 229. The sense amplifier 229 may be configured to amplify the voltage difference on the bitline pair BL and BLB and output a result to the data input/output bus 230 (see FIG. 2) and to a system outside of the memory 110 (e.g., to the at least one processor 102 via the bus system 104; see FIG. 1).

In a write operation, in reference to FIG. 2, the write driver 221 (see FIG. 2) may be configured to receive input for write from, for example, the at least one processor 102 via the bus system 104 (see FIG. 1) and/or the data input/output bus 230 (see FIG. 2). The write driver 221 may be further configured to drive the input as write data to the bitline pair BL and BLB, selected via the multiplexer 228. For example, the write driver 221 may be configured to discharge (e.g., to pull down) the bitline BL of the selected column to a low voltage level (e.g., ground) and to charge (e.g., to pull up) the bitline BLB to a high voltage level. In some examples, the high and low voltage levels may be relative terms (e.g. compared to each other). Referring to FIG. 3, in an example that the storage node 342 stores logic zero (e.g., low voltage level such as ground) and the storage node 344 stores logic one (e.g., a high voltage level such as VDD) prior to the write access, the bitline BL being driven to the low voltage level would pull the storage node 344 to the low voltage level (e.g., ground or near ground) via the access transistor 348. The bit stored by the memory cell 214 may flip state accordingly. In such fashion, a different state is written into the memory cell 214.

FIG. 4 illustrates the memory 110 of FIGS. 1-2 having an improved write assist scheme, in accordance with certain aspects of the present disclosure. FIG. 4 includes the memory cell 214 of FIGS. 2-3, the multiplexer 228 of FIG. 2, a power supply 420, an isolation transistor 422, a discharge circuit 432, a precharge circuit 450, and a write driver 221 (See FIG. 2). FIG. 4 further includes the discharge circuit 432 having a control transistor 430 and discharge transistors 442 and 444. The power supply 420 may be configured to provide power from a supply voltage VDD to a power supply node 325. The power supply 420 may, for example, include a head switch and/or comprise a transistor (not shown) electrically connecting the supply voltage VDD and the power supply node 325.

The isolation transistor 422 may be configured to isolate the power supply node 325 from the power supply 420 while the discharge circuit 432 discharges the power supply node 325 to the bitline BL or BLB, to assist in a write operation. Further details of write assist in the write operation will be presented below. The isolation transistor 422 may be further configured to be controlled (e.g., turned on and off) by a write signal or a signal indicating a write operation. In some examples, the isolation transistor 422 may include a p-type transistor having a gate electrically connected to a node 423. The write signal (or signal indicating a write operation) may be provided via the node 423 and may indicate, inter alia, a state of being in a write operation. In some examples, the isolation transistor 422 isolating the power supply node 325 from the power supply 420 may isolate the power supply node 325 from being pulled up (e.g., to VDD). For example, the power supply node 325 might be isolated from all or any pull-up sources as a result of the isolation transistor 422 isolating the power supply node 325 from the power supply 420.

The power supply node 325 may be configured to provide power from the power supply 420 to the memory cell 214 of the memory cells 214_1_1 to 214_2'''_2'' (FIG. 2) to store data in the memory cell 214. In some examples, the power supply node 325 may be configured to provide power to a portion of the multiple columns of the memory array 212 (see FIG. 2). In some examples, the power supply node 325 may be configured to provide power to one column of the multiple columns of the memory array 212. In some examples, the cross-coupled inverter 332 and 334 of the memory cell 214 may be powered via the power supply node 325, and accordingly, data stored at the storage nodes 342 and 344 may be powered via the power supply node 325.

The bitline pair BL and BLB may be configured to provide write data (or versions of write data) to the memory cell 214 in a write operation. The precharge circuit 450 may be configured to precharge the bitline pair BL and BLB to a level prior to the write operation. For example, the precharge circuit 450 may be configured to precharge the bitlines BL and BLB to VDD prior to the write operation.

The write driver 221 may be configured to drive the bitline pair BL and BLB based on write data to write into the memory cell 214. For example, the write driver 221 may be configured to discharge the bitline BL of the selected column to a low voltage level (e.g., ground) and to charge (e.g., to pull up to, e.g., VDD) the bitline BLB to a high voltage level in response to the write data being in a first state. The write driver 221 may be further configured to discharge the bitline BLB of the selected column to a low voltage level (e.g., ground) and to charge (e.g., to pull up to, e.g., VDD) the bitline BL to a high voltage level in response to the write data being in a second state. The first state and the second state may be different. In such fashion, a bitline pair, such as BL and BLB, may be of complementary bitlines. For example, the bitline BL may be a complement bitline of the bitline BLB, and vice versa, to carry write data in a wrote operation. The write driver 221 may be configured to drive (e.g., to discharge or to pull-up) the bitline pair BL and BLB via the multiplexer 228 (shown with decoded column address 227 controlling the multiplexer 228).

The discharge circuit 432 may be configured to selectively discharge the power supply node 325 to the bitline BL (or BLB), based on the write data. For example, the discharge circuit 432 may be configured to discharge the power supply node 325 to the bitline BL (or BLB) in response to the write data being in a state that causes the write driver 221 to charge the bitline BL (or BLB). For example, the write driver 221 may be configured to output a logic one or high voltage to the selected bitline BL (or BLB) via the multiplexer 228 to charge the bitline BL (or BLB), based on a state of the write data. Thus, the discharge circuit 432 may be configured to select one of the bitline pair BL and BLB to discharge the power supply node 325, in accordance with the write data.

In some examples, the discharge circuit 432 may include a control transistor 430, a discharge transistor 442, and a second discharge transistor 444. In some examples, the control transistor 430, the discharge transistor 442, and/or the second discharge transistor 444 may be p-type transistor or transistors. The control transistor 430 may be configured to couple to the power supply node 325, the discharge transistor 442, and the second discharge transistor 444. For example, the control transistor 430 may be configured to electrically connect to the power supply node 325 and to electrically connect to the discharge transistor 442 and the second discharge transistor 444 via the node 431. The control transistor 430 may be configured to turn on to enable discharging the power supply node 325, based on a signal indicating the write operation. For example, the control transistor 430 may include a gate electrically connected to a node 433. An inverse of the write signal may be provided via the node 433 and may indicate, inter alia, a state of being in the write operation. For example, the signal on the node 433 being at logic zero may indicate that the write operation is active.

In some examples, the discharge transistor 442 may be configured to electrically connect to the bitline BLB to discharge the power supply node 325 to the bitline BLB, in response to the write data being in the state (e.g., the first state) that causes the write drive to charge the bitline BLB. For example, the discharge transistor 442 may include a gate electrically connected to a node 443. A signal may be provided via the node 443 and may indicate, inter alia, an inverse of the write data. For example, the discharge transistor 442 may turn on to discharge the power supply node 325 to bitline BLB, in response to the write data being logic one. The wrote data being logic one may cause the write driver 221 to output logic one onto the bitline BLB to charge the bitline BLB via the multiplexer 228 (e.g., in a case the bitline BLB dips below VDD−Vth; Vth being a threshold voltage of an n-type transistor of the multiplexer 228). In such fashion, the control transistor 430 and the discharge transistor 442 may be configured to discharge the power supply node 325 to the bitline BLB in series.

The second discharge transistor 444 may be configured to electrically connect to the bitline BL to discharge the power supply node 325 to the bitline BL, in response to the write data being in the state (e.g., the second state) that causes the write drive to charge the bitline BL. For example, the second discharge transistor 444 may include a gate electrically connected to a node 445. A signal may be provided via the node 445 and may indicate, inter alia, the write data. For example, the second discharge transistor 444 may turn on to discharge the power supply node 325 to bitline BL, in response to the write data being logic zero. The wrote data being logic zero may cause the write driver 221 to output logic one onto the bitline BL to charge the bitline BL via the multiplexer 228 (e.g., in a case the bitline BL dips below VDD−Vth; Vth being a threshold voltage of an n-type transistor of the multiplexer 228). In such fashion, the control transistor 430 and the discharge transistor 444 may be configured to discharge the power supply node 325 to the bitline BL in series. As presented above, the bitline BL may be a complement bitline of the bitline BLB, and vice versa, because each of the bitline pair BL and BLB being pulled low represent a different state of the write data.

Figure 5:
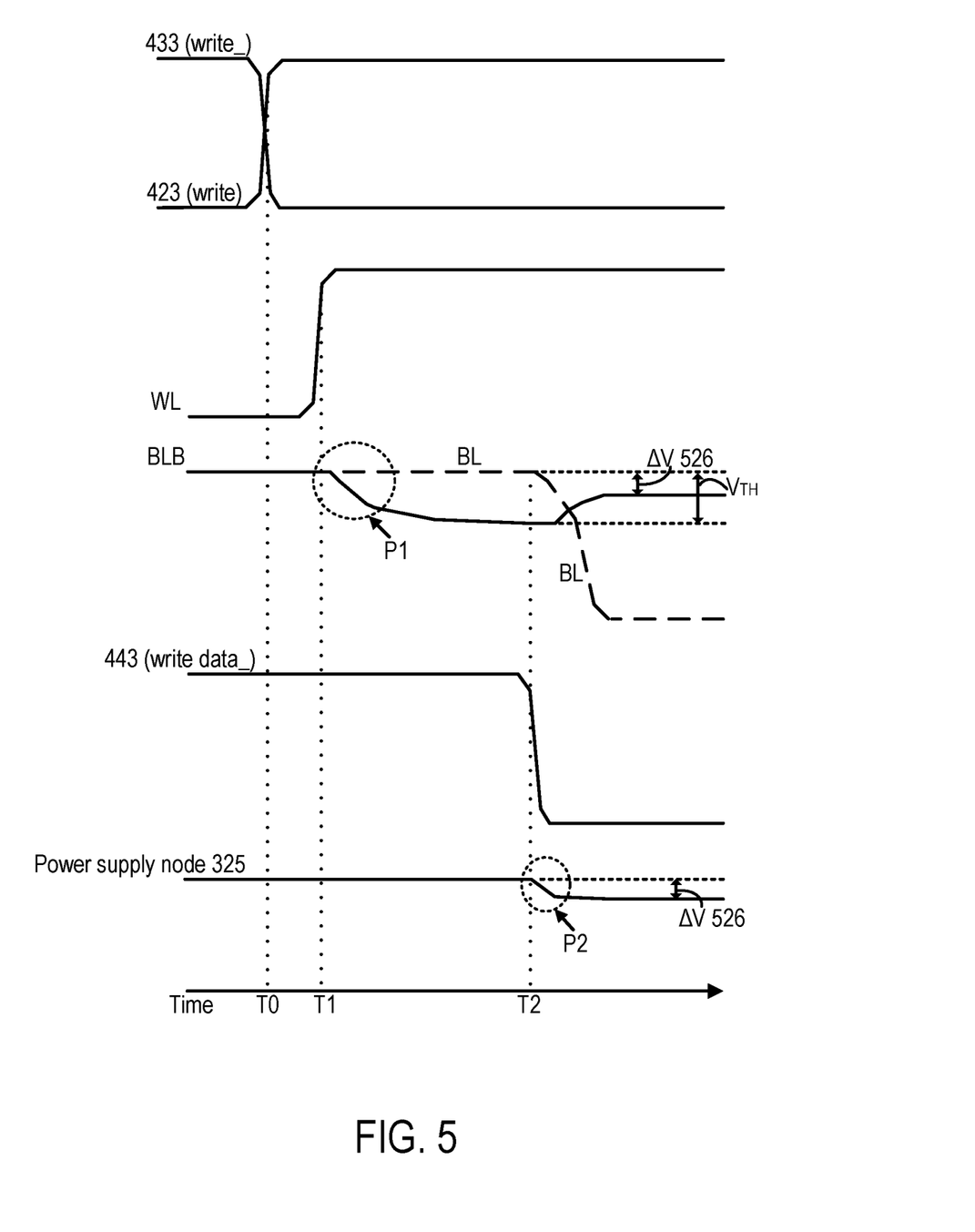
FIG. 5 illustrates waveforms of a write operation with the improved write assist scheme of FIG. 4, in accordance with certain aspects of the disclosure.

FIG. 5 illustrates waveforms of a write operation with the improved write assist scheme of FIG. 4, in accordance with certain aspects of the disclosure. Time is illustrated in the X-axis. FIG. 5 is presented in reference with FIG. 4. By way of example, a logic zero is stored at the storage node 342 and a logic one is stored the storage node 344. Thus, prior to the write operation, the memory cell 214 maintains the storage node 342 at ground and the storage node 344 at VDD. The terms "high" and "low" may be relative and referenced in terms of voltage.

Prior to a write operation, the precharge circuit 450 precharges the bitlines BL and BLB to VDD. At T0, a signal at the node 423 goes high to logic one or VDD and a signal at the node 433 goes low to logic zero or ground, indicating the write operation being enabled. The precharge circuit 450 may be turned off at the start of the write operation. The isolation transistor 422 is turned off (by the signal at the node 423 going high), isolating the power supply node 325 from the power supply 420. Subsequently, in some examples, the power supply node 325 is isolated from being pulled up (e.g., the power supply node 325 being not electrically connected to any pull-up circuits). The control transistor 430 is turned on by the signal at the node 433 going low, electrically connecting the power supply node 325 to the node 431.

At T1, the wordline WL goes high to logic one or VDD. The access transistors 346 and 348 within the memory cell 214 are turned on, electrically connecting the storage node 342 to the bitline BLB and the storage node 344 to the bitline BL. Consequently, the bitline BLB is discharged through the access transistor 346 and the storage node 342 (see P1 in FIG. 5). The bitline BL is not discharged, since the storage node 344 electrically connected thereto is at logic one or VDD. Accordingly, the power supply node 325 is isolated by the isolation transistor 422 from the power supply 420 while the discharge circuit 432 discharges the power supply node 325 to the bitline BLB.

At T2, a signal at the node 443 (e.g., an active low indicator of a write operation) goes low, turning on the discharge transistor 442. A signal at the node 445 (e.g., an active high indicator of a write data; not shown in FIG. 5) remains high to keep the discharge transistor 444 off. Consequently, the power supply node 325 is discharged to the bitline BLB via the control transistor 430 and the discharge transistor 442 (see P2 in FIG. 5). Further, as a result, the bitline BLB is pulled up by the discharging power supply node 325 via charge sharing between the bitline BLB and the power supply node 325. FIG. 5 further illustrates that a voltage on the power supply node 325 is pulled down by $\Delta V$ 526. The lowering of the voltage on the power supply node 325 powering the memory cell 214 and/or higher BLB voltage help with write margin in writing into the memory cell 214. For example, chances of successfully overwriting the memory cell 214 with write data are improved by the lowering of the voltage on the power supply node 325 and/or higher voltage of the bitline BLB, as a strength of the inverter 334 of the memory cell 214 to fight the pulling down of bitline BL is reduced by the voltage on the power supply node 325 being lowered.

Further, the write driver 221 is turned on to output write data onto the bitline pair BL and BLB. In the example of FIG. 5, the write driver 221 outputs write data to the bitline BLB and an inverse of the write data to the bitline BL, via n-type transistors of the multiplexer 228 (see FIG. 4). To flip a bit stored in the memory cell 214, in the example, the write driver 221 charges (e.g., pulls up) the bitline BLB high and pulls the bitline BL low by outputting a logic one onto the bitline BLB and a logic zero onto the bitline BL. As illustrated in FIG. 5, the bitline BL is pulled low to logic zero or ground. The write driver 221 may stay put or pull up the bitline BLB to VDD-$V_{TH}$ (a threshold voltage of an n-type transistor of the multiplexer 228), depending on the BLB voltage level. For example, if the BLB voltage level is higher than VDD-$V_{TH}$ after charge sharing with power supply node 325 is complete, the write driver 221 will not charge the BLB. On the other hand, if the BLB voltage level is lower than VDD-$V_{TH}$ after charge sharing, then the write driver 221 will pull up the bitline BLB to VDD-$V_{TH}$.

In such fashion, the discharge circuit 432 (see FIG. 4) may be configured to discharge the power supply node 325 to the bitline BLB to pull up the bitline BLB to a level above the write driver 221 charging the bitline BLB. For example, the discharge circuit 432 discharging the power supply node 325 to the bitline BLB could pull up bitline BLB to a level higher than the write driver 221 alone could pull up the bitline BLB. For example, referring to FIG. 5, the write driver 221 is configured to charge or to pull up the bitline BLB to VDD-$V_{TH}$, as the write driver 221 outputs a logic one onto the bitline BLB via the multiplexer 228 (see FIG. 4). The discharge circuit 432 (see FIG. 4) discharging the power supply node 325 to the bitline BLB pulls up the bitline BLB to VDD-$\Delta V$ 526, which is higher than VDD-$V_{TH}$. Thus, with assist from a lowered voltage on the power supply node 325 and a raised voltage on the bitline BLB, the bitline BL going low may be able to flip a value stored in the memory cell 214, thereby entering write data into the memory cell 214.

Figure 6:
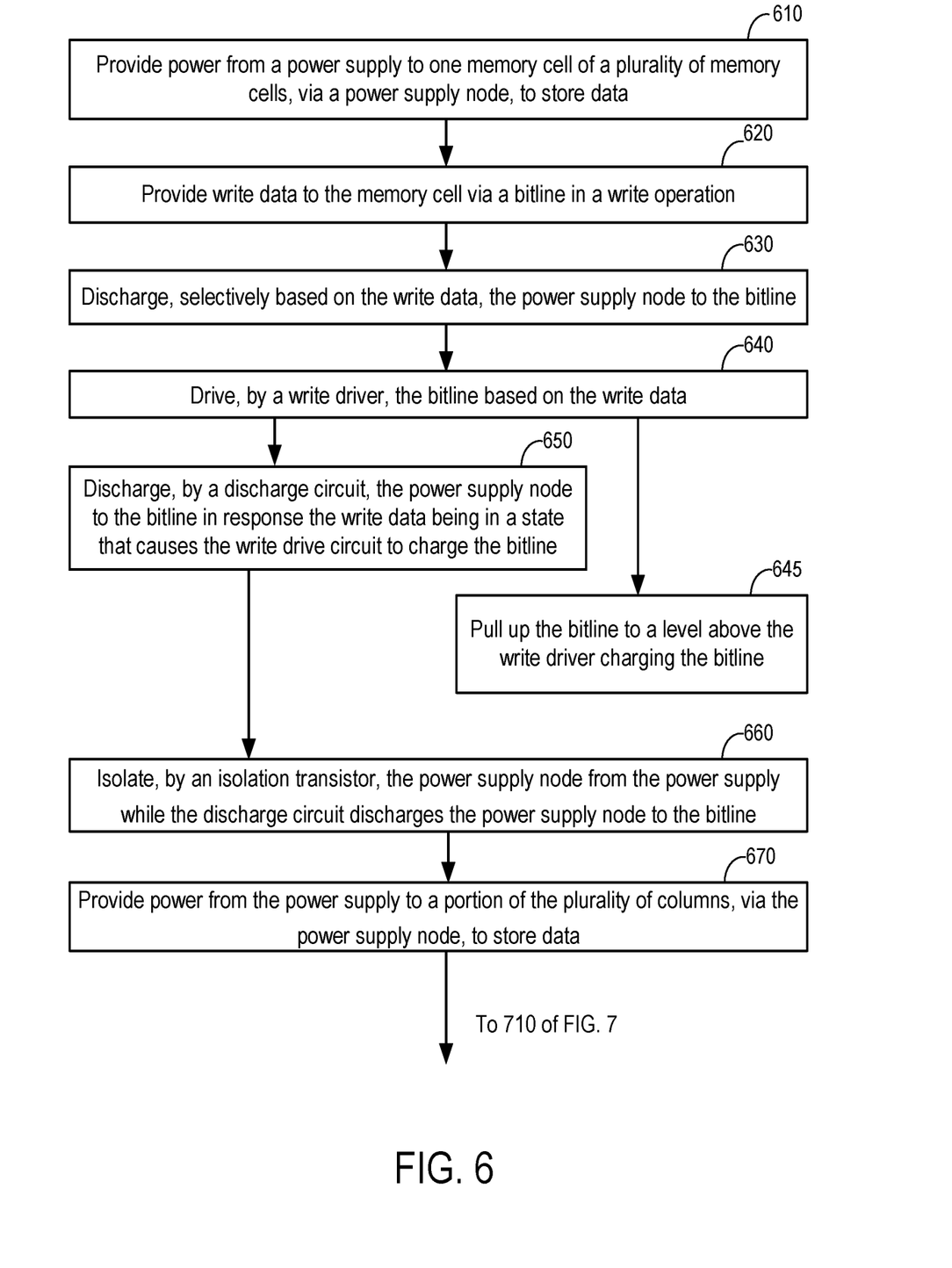
FIG. 6 illustrates a method to write into a memory cell with the write assist scheme presented with FIGS. 4 and 5, in accordance with certain aspects of the disclosure.

FIG. 6 illustrates a method to write into a memory cell with the write assist scheme presented with FIGS. 4 and 5, in accordance with certain aspects of the disclosure. Operations of FIG. 6 may be implemented by, for example, the memory 110 presented with FIGS. 1-4. The arrows indicate certain relationships among the operations, but not necessarily sequential relationships. At 610, power is provided a power supply to one memory cell of a plurality of memory cells, via a power supply node, to store data. For example, referring to FIG. 4, power is provided by the power supply 420 to the memory cell 214 (of the memory array 212; see FIG. 2), via the power supply node 325, to store data. At 620, write data is provided to the memory cell via a bitline in a write operation. For example, referring to FIG. 4, write data is provided to (e.g., to be written into) the memory cell 214 via bitlines BL and/or BLB.

At 630, the power supply node is selectively discharged, based on the write data, to the bitline. For example, referring to FIG. 4, the power supply node 325 may be selected to discharge or to not discharge to the bitline BLB based on write data. For example, in a case the write data is a logic zero, the signal on the node 443 indicating an inverse of the write data would be at logic one (high voltage or VDD), turning the discharge transistor 442 off. In this case, the power supply node 325 is selected to not discharge to the bitline BLB based on the write data being a logic zero, in a write operation. The signal at the node 445 indicating the write data would be at logic zero (low voltage or ground), turning on the discharge transistor 444. The power supply node 325 is selected to discharge to the bitline BL based on the write data being a logic zero in the write operation.

In a case the write data is a logic one, the signal on the node 443 indicating an inverse of the write data would be at logic zero (low voltage or ground), turning the discharge transistor 442 on. In this case, the power supply node 325 is selected to discharge to the bitline BLB based on the write data being a logic one, in a write operation. The signal at the node 445 indicating the write data would be at logic one (high voltage or VDD), turning off the discharge transistor 444. The power supply node 325 is thus not selected to discharge to the bitline BL based on the write data being a logic one in the write operation.

At 640, the bitline is driven by a write driver based on the write data. For example, referring to FIG. 4, the write driver 221 discharges the bitline BLB (e.g., to a low voltage or ground) and charges the bitline BL (e.g., to a high voltage or VDD-$V_{TH}$), based on the write data being logic zero. The write driver 221 charges the bitline BLB (e.g., to a high voltage or VDD-$V_{TH}$) and discharges the bitline BL (e.g., to a low voltage or ground), based on the write data being logic one. At 650, the power supply node is discharged by a discharge circuit to the bitline in response to the write data being in a state that causes the write drive circuit to charge the bitline. For example, referring to FIG. 4, the second discharge transistor 444 includes a gate electrically connected to a node 445. A signal is provided via the node 445 and indicates, inter alia, the write data. For example, second discharge transistor 444 is turned on to discharge the power supply node 325 to bitline BL, in response to the write data being logic zero. The wrote data being logic zero causes the write driver 221 to output logic one onto the bitline BL to charge the bitline BL via the multiplexer 228 (e.g., in a case the bitline BL dips below VDD-$V_{TH}$; $V_{TH}$ being a threshold voltage of an n-type transistor of the multiplexer 228).

At 645, the bitline is pulled up to a level above the write driver charging the bitline. For example, referring to FIG. 5, the discharge circuit 432 discharging the power supply node 325 to the bitline BLB could pull up bitline BLB to a level higher than the write driver 221 alone could pull up the bitline BLB. For example, the write driver 221 charges or to pulls up the bitline BLB to VDD-$V_{TH}$, as the write driver 221 outputs a logic one onto the bitline BLB via the multiplexer 228 (see FIG. 4). The discharge circuit 432 (see FIG. 4) discharging the power supply node 325 to the bitline BLB pulls up the bitline BLB to VDD-$\Delta V$ 526, which is higher than VDD-$V_{TH}$.

At 660, the power supply node is isolated by an isolation transistor from the power supply while the discharge circuit discharges the power supply node to the bitline. For example, referring to FIG. 4, the isolation transistor 422 is controlled (e.g., turned on and off) by a write signal. The isolation transistor 422 includes a p-type transistor having a gate electrically connected to a node 423. The write signal is provided via the node 423 and indicates, inter alia, a state of being in a write operation. The isolation transistor 422 isolates the power supply node 325 from the power supply 420 also isolates the power supply node 325 from being pulled up. For example, the power supply node 325 is isolated from all or any pull-up sources as a result of the isolation transistor 422 isolating the power supply node 325 from the power supply 420. Referring to FIG. 5, the isolation transistor 422 is turned off Referring to FIG. 5, At T0, a start of a write operation turns off the isolation transistor 422. At T1, the wordline WL goes high to logic one or VDD. The access transistors 346 and 348 within the memory cell 214 are turned on, electrically connecting the storage node 342 to the bitline BLB and the storage node 344 to the bitline BL. Consequently, the bitline BLB is discharged through the access transistor 346 and the storage node 342 (see P1 in FIG. 5). The bitline BL is not discharged, since the storage node 344 electrically connected thereto is at logic one or VDD. Accordingly, the power supply node 325 is isolated by the isolation transistor 422 from the power supply 420 while the discharge circuit 432 discharges the power supply node 325 to the bitline BLB.

Figure 7:
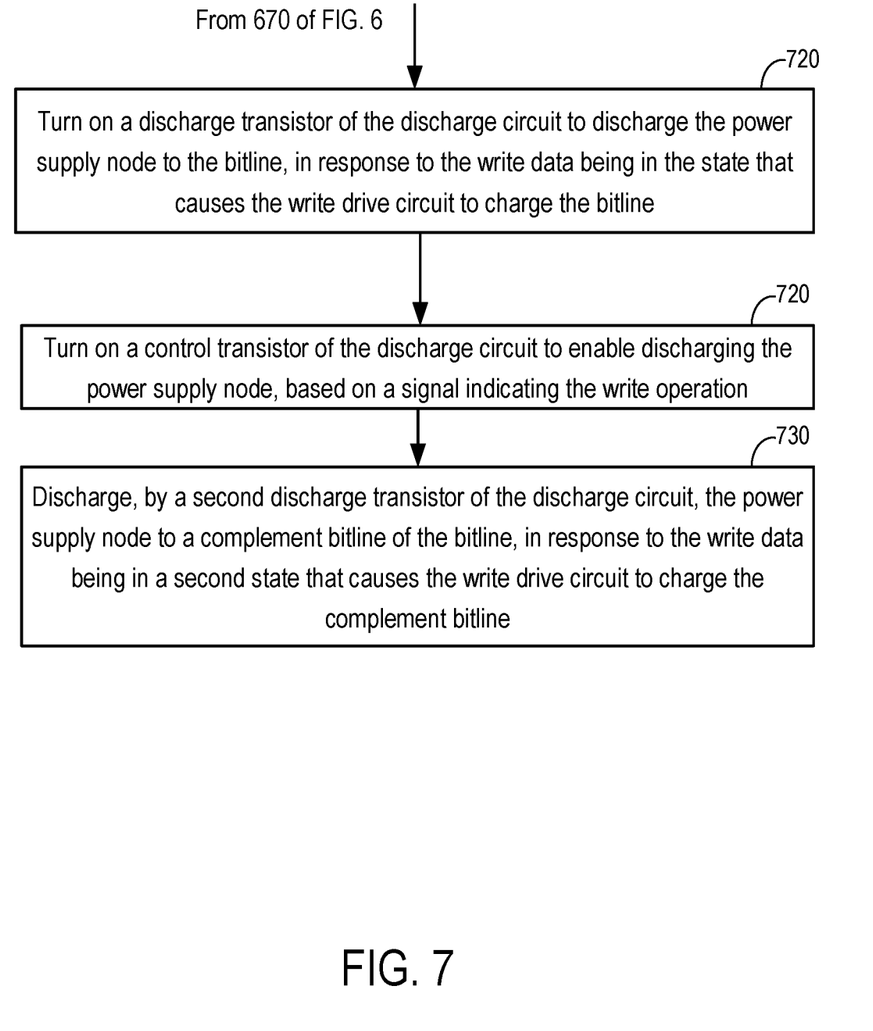
FIG. 7 illustrates additional operations of the method to write into a memory cell with the write assist scheme presented of FIG. 6, in accordance with certain aspects of the disclosure.

At 670, power is provided from the power supply to a portion of the plurality of columns, via the power supply node, to store data. For example, referring to FIG. 4, the power supply node 325 provides power from the power supply 420 to one (and, e.g., only one) column, therefore a portion, of multiple columns of the memory array 212 (see FIG. 2). Operations may continue at 710 of FIG. 7, FIG. 7 illustrates additional operations of the method to write into a memory cell with the write assist scheme presented of FIG. 6, in accordance with certain aspects of the disclosure. Operations may flow from 670 of FIG. 6. At 710, a discharge transistor of the discharge circuit is turned on to discharge the power supply node to the bitline, in response to the write data being in the state that causes the write drive circuit to charge the bitline. At 730, the power supply node is discharged by a second discharge transistor of the discharge circuit to a complement bitline of the bitline, in response to the write data being in a second state that causes the write drive circuit to charge the complement bitline. For example, referring to FIG. 4, the discharge transistor 442 electrically connects to the bitline BLB to discharge the power supply node 325 to the bitline BLB, in response to the write data being in the state (e.g., the first state; e.g., logic one) that causes the write drive to charge the bitline BLB. The second discharge transistor 444 electrically connects to the bitline BL to discharge the power supply node 325 to the bitline BL, in response to the write data being in the state (e.g., the second state; e.g., logic zero) that causes the write drive to charge the bitline BL.

At 730, a control transistor of the discharge circuit is turned on to enable discharging the power supply node, based on a signal indicating the write operation. For example, referring to FIG. 4, the control transistor 430 is turned on to enable discharging the power supply node 325, based on a signal on a gate indicating the write operation. The control transistor 430 includes a gate electrically connected to a node 433. An inverse of the write signal is provided via the node 433 and indicates, inter alia, a state of being in the write operation. For example, the signal on the node 433 being at logic zero indicates that the write operation is active.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:
1. An apparatus, comprising:
   a plurality of memory cells;
   a power supply node configured to provide power from a power supply to one memory cell of the plurality of memory cells to store data;

an isolation transistor coupled between the power supply and the power supply node, the isolation transistor configured to be turned off to isolate the power supply node from the power supply during a write operation;
a bitline configured to provide write data to the one memory cell in the write operation; and
a discharge circuit configured to couple the power supply node to the bitline when the write data is in a first state.

2. The apparatus of claim 1, further comprising:
a write driver configured to drive the bitline based on the write data, the discharge circuit being further configured to discharge the power supply node to the bitline in response to the write data being in a state that causes the write drive circuit to charge the bitline.

3. The apparatus of claim 2, the discharge circuit being configured to discharge the power supply node to the bitline to pull up the bitline to a level above the write driver charging the bitline.

4. The apparatus of claim 2, wherein the isolation transistor isolating the power supply node from the power supply isolates the power supply node from being pulled up.

5. The apparatus of claim 2, the plurality of memory cells being arranged as a plurality of columns, the power supply node being configured to provide power to a portion of the plurality of columns.

6. The apparatus of claim 5, the portion of the plurality of columns being one column.

7. The apparatus of claim 5, further comprising a device selected from one of a computing system, a mobile computing system, an Internet of Things device, a virtual reality system, or an augmented reality system,
the device incorporating the plurality of memory cells, the power supply node, the bitline, and the discharge circuit.

8. The apparatus of claim 7, the discharge circuit comprising a discharge transistor, the discharge transistor being configured to turn on to discharge the power supply node to the bitline, in response to the write data being in the state that causes the write drive circuit to charge the bitline.

9. The apparatus of claim 8, the discharge transistor comprising a p-type transistor.

10. The apparatus of claim 8, the discharge circuit further comprising a control transistor configured to turn on to enable discharging the power supply node, based on a signal indicating the write operation.

11. The apparatus of claim 10, the control transistor and the discharge transistor being configured to discharge the power supply node in series.

12. The apparatus of claim 11, the control transistor and the discharge transistor being p-type transistors.

13. The apparatus of claim 10, the discharge circuit comprising a second discharge transistor,
the control transistor being coupled to the power supply node, the discharge transistor, and the second discharge transistor,
the discharge transistor being electrically connected to the bitline to discharge the power supply node to the bitline, in response to the write data being in the state that causes the write drive circuit to charge the bitline,
the second discharge transistor being electrically connected to a complement bitline of the bitline to discharge the power supply node to the complement bitline, in response to the write data being in a second state that causes the write drive circuit to charge the complement bitline.

14. The apparatus of claim 13, the control transistor, the discharge transistor, and the second discharge transistor being p-type transistors.

15. A method to write into a memory cell with a write assist scheme, comprising:
providing power from a power supply to one memory cell of a plurality of memory cells, via a power supply node, to store data;
isolating, by an isolation transistor coupled between the power supply and the power supply node, the power supply node from the power supply by turning off the isolation transistor during a write operation;
providing write data to the one memory cell via a bitline in the write operation; and
discharging the power supply node to the bitline when the write data is in a first state.

16. The method of claim 15, further comprising:
driving, by a write driver, the bitline based on the write data;
discharging, by a discharge circuit, the power supply node to the bitline in response the write data being in a state that causes the write drive circuit to charge the bitline.

17. The method of claim 16, discharging by the discharge circuit the power supply node to the bitline comprising pulling up the bitline to a level above the write driver charging the bitline.

18. The method of claim 16, wherein the isolation transistor isolating the power supply node from the power supply isolates the power supply node from being pulled up.

19. The method of claim 16, the plurality of memory cells being arranged as a plurality of columns, further comprising:
providing power from the power supply to a portion of the plurality of columns, via the power supply node, to store data.

20. The method of claim 19, the portion of the plurality of columns being one column.

21. The method of claim 19, further comprising turning on a discharge transistor of the discharge circuit to discharge the power supply node to the bitline, in response to the write data being in the state that causes the write drive circuit to charge the bitline.

22. The method of claim 21, the discharge transistor comprising a p-type transistor.

23. The method of claim 21, further comprising turning on a control transistor of the discharge circuit to enable discharging the power supply node, based on a signal indicating the write operation.

24. The method of claim 23, the power supply node being discharged by the control transistor and the discharge transistor in series.

25. The method of claim 24, the control transistor and the discharge transistor being p-type transistors.

26. The method of claim 23, further comprising
discharging, by a second discharge transistor of the discharge circuit, the power supply node to a complement bitline of the bitline, in response to the write data being in a second state that causes the write drive circuit to charge the complement bitline.

27. The method of claim 26, the control transistor, the discharge transistor, and the second discharge transistor being p-type transistors.

* * * * *